United States Patent
Hsu et al.

(10) Patent No.: US 9,627,346 B2
(45) Date of Patent: Apr. 18, 2017

(54) UNDERFILL PATTERN WITH GAP

(71) Applicant: Taiwan Semiconductor Manufacturing Company, Ltd., Hsin-Chu (TW)

(72) Inventors: Feng-Cheng Hsu, New Taipei (TW); Hou-Ju Huang, Zhubei (TW); Szu-Wei Lu, Hsin-Chu (TW); Jing-Cheng Lin, Chu-Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 135 days.

(21) Appl. No.: 14/103,411

(22) Filed: Dec. 11, 2013

(65) Prior Publication Data

US 2015/0162258 A1    Jun. 11, 2015

(51) Int. Cl.
*H01L 23/48*    (2006.01)
*H01L 29/40*    (2006.01)
(Continued)

(52) U.S. Cl.
CPC ............ *H01L 24/81* (2013.01); *H01L 21/563* (2013.01); *H01L 23/315* (2013.01); *H01L 23/3128* (2013.01); *H01L 24/32* (2013.01); *H01L 24/73* (2013.01); *H01L 24/92* (2013.01); *H01L 24/16* (2013.01); *H01L 24/29* (2013.01); *H01L 2224/04105* (2013.01); *H01L 2224/11002* (2013.01); *H01L 2224/11334* (2013.01); *H01L 2224/12105* (2013.01); *H01L 2224/131* (2013.01); *H01L 2224/16227* (2013.01); *H01L 2224/2919* (2013.01); *H01L 2224/32057* (2013.01); *H01L 2224/32059* (2013.01); *H01L 2224/32225* (2013.01); *H01L 2224/33155* (2013.01); *H01L 2224/73204* (2013.01); *H01L 2224/81191* (2013.01); *H01L 2224/81815* (2013.01); *H01L 2224/83104* (2013.01); *H01L 2224/92125* (2013.01);
(Continued)

(58) Field of Classification Search
CPC ...... H03H 9/059; H01L 21/563; H01L 23/315
USPC .......................................... 257/734
See application file for complete search history.

(56) References Cited

U.S. PATENT DOCUMENTS 5,459,368 A * 10/1995 Onishi ................. H03H 9/0542
                                                310/313 R
5,969,461 A * 10/1999 Anderson ............... H01L 24/32
                                                174/260

(Continued)

*Primary Examiner* — Andy Huynh
*Assistant Examiner* — Sitaramarao S Yechuri
(74) *Attorney, Agent, or Firm* — Slater Matsil, LLP

(57) ABSTRACT

An embodiment is a structure comprising a package, a substrate, and external electrical connectors mechanically and electrically coupling the package to the substrate. The package contains a die. The external electrical connectors are between the package and the substrate. An underfill material is around a periphery region of the package and between the periphery region and the substrate. A gap is between a central region of the package and the substrate, and does not contain the underfill material. The underfill material may seal the gap. The gap may be an air gap. In some embodiments, the underfill material may fill greater than or equal to 10 percent and no more than 70 percent of a volume between the package and the substrate.

20 Claims, 4 Drawing Sheets

(51) Int. Cl.
  *H01L 23/00* (2006.01)
  *H01L 23/31* (2006.01)
  *H01L 21/56* (2006.01)

(52) U.S. Cl.
  CPC .......... *H01L 2924/12042* (2013.01); *H01L 2924/15788* (2013.01); *H01L 2924/181* (2013.01); *H01L 2924/18162* (2013.01)

(56) References Cited

U.S. PATENT DOCUMENTS

| | | | |
|---|---|---|---|
| 6,649,446 B1 * | 11/2003 | Goetz et al. | 438/110 |
| 6,754,950 B2 * | 6/2004 | Furukawa | H01L 21/56 257/E21.502 |
| 6,800,946 B2 * | 10/2004 | Chason | B81C 1/00333 257/100 |
| 6,815,869 B2 * | 11/2004 | Baba | H01L 23/3121 310/313 R |
| 7,871,865 B2 | 1/2011 | Sengupta et al. | |
| 8,212,355 B2 * | 7/2012 | Sunohara et al. | 257/737 |
| 2002/0060368 A1 * | 5/2002 | Jiang | H01L 21/563 257/778 |
| 2004/0159960 A1 * | 8/2004 | Fujiwara et al. | 257/783 |
| 2004/0222519 A1 * | 11/2004 | Aoyagi | 257/734 |
| 2005/0218528 A1 * | 10/2005 | Beatty et al. | 257/778 |
| 2007/0054506 A1 * | 3/2007 | Libres | H01L 21/563 438/789 |
| 2011/0020985 A1 * | 1/2011 | Ofner | H01L 21/563 438/124 |
| 2011/0063606 A1 * | 3/2011 | Babiarz | G01N 21/95 356/237.1 |
| 2011/0210444 A1 * | 9/2011 | Jeng | H01L 23/13 257/738 |
| 2012/0061854 A1 * | 3/2012 | Chow | H01L 21/563 257/778 |
| 2012/0112344 A1 * | 5/2012 | Shibuya et al. | 257/737 |
| 2012/0288996 A1 * | 11/2012 | Too | H01L 21/563 438/108 |
| 2013/0175686 A1 * | 7/2013 | Meyer | H01L 25/0655 257/738 |
| 2013/0234344 A1 | 9/2013 | Juskey et al. | |
| 2014/0015123 A1 * | 1/2014 | Bowles et al. | 257/737 |
| 2015/0001729 A1 * | 1/2015 | Lan et al. | 257/773 |

\* cited by examiner

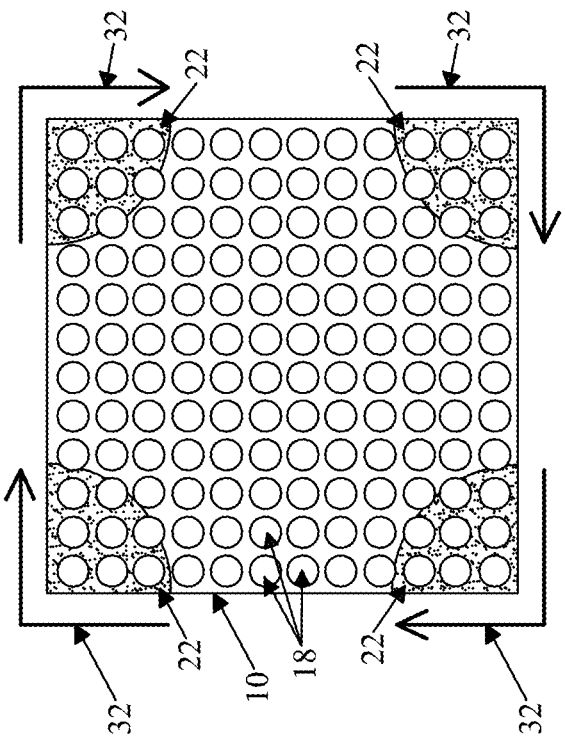
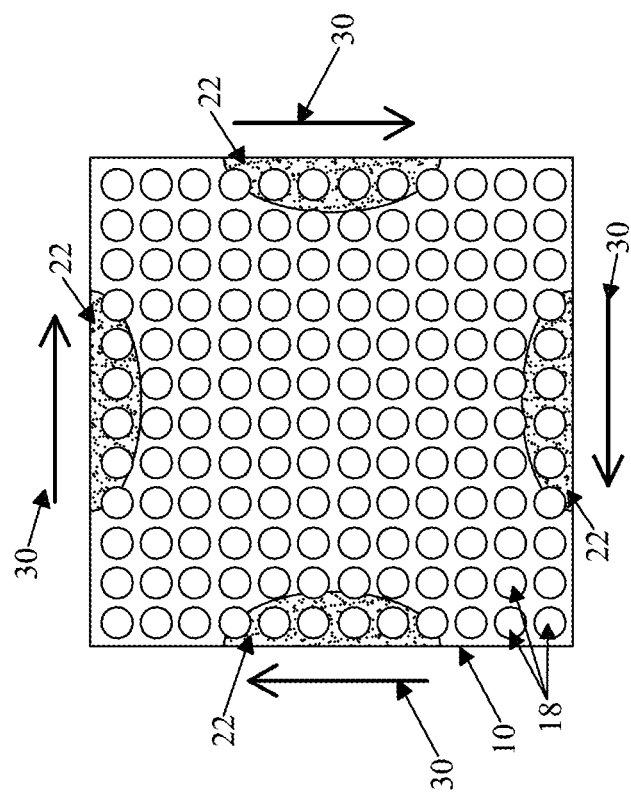

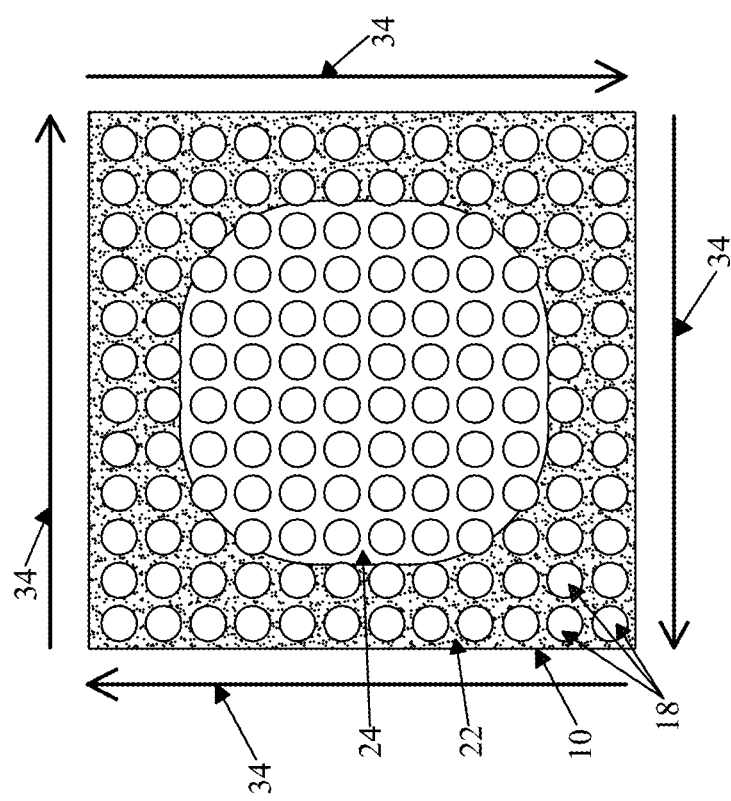

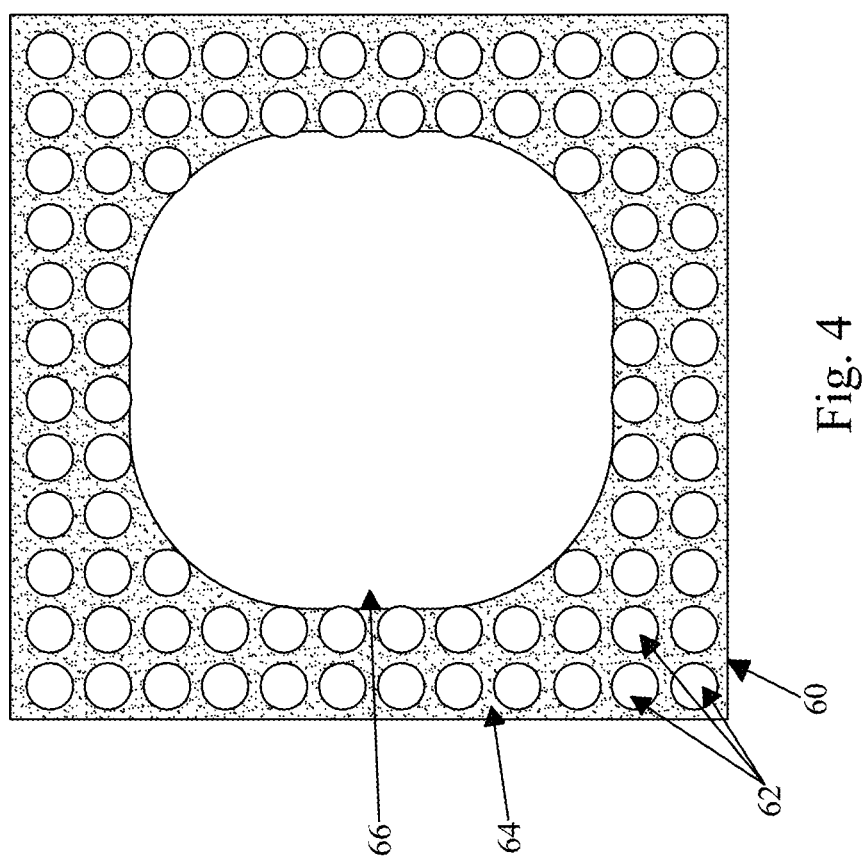

UNDERFILL PATTERN WITH GAP

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry has developed many ways in which dies can be packaged. In recent years, dies and/or packages containing a die are frequently attached to some other substrate, package, die, or interposer using solder balls or bumps. In many of these applications, an underfill material is used to fill the space between the die/package and other component. By filling the space, the underfill is thought to provide greater mechanical integrity to the bond by providing additional bonding and support to the balls or bumps.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A, 2B, and 3 are examples of two-pass dispense processes according to embodiments; and FIG. 4 is an example layout view of a pattern of external electrical connectors on a package according to an embodiment.

DETAILED DESCRIPTION OF ILLUSTRATIVE EMBODIMENTS

Figure 1:
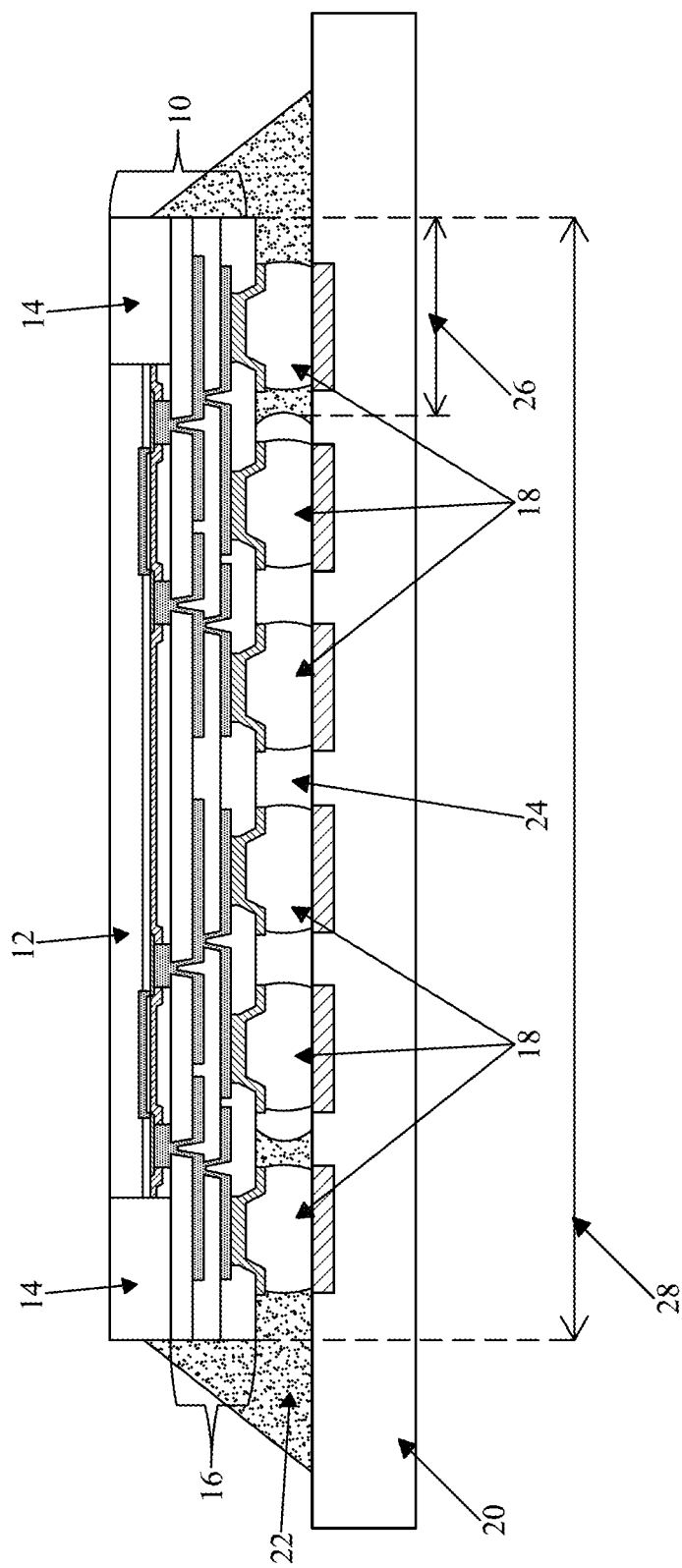
FIG. 1 is a wafer-level-package (WLP) on a substrate according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely a wafer-level-package structure. Some embodiments may be applied to a wire-bonded package structure, a package-on-package structure, or the like. Other embodiments may also be applied to other structures where an underfill material may be used, such as in flip-chip structures, interposer on a substrate, stacked dies, or the like. Like reference numbers in the figures below refer to like components. Method embodiments may be discussed as being performed in a particular order, but other method embodiments may be performed in any logical order.

FIG. 1 illustrates a wafer-level-package (WLP) example according to an embodiment. The structure includes, for example, a fan-out WLP (FOWLP) package 10 that includes a die 12 encapsulated by an encapsulant 14, such as a molding compound, and a redistribution structure 16. The structure further includes a substrate 20, such as a printed circuit board (PCB), organic substrate, or the like. External electrical connectors 18, such as ball grid array (BGA) balls, bumps, or other electrical connectors, mechanically couple the package 10 to the substrate 20 and further electrically couple, in combination with the redistribution structure 16, the die 12 to the substrate 20. The redistribution structure 16 includes bond structures, such as under bump metal (UBM) structures, post-passivation interconnect (PPI) structures, trace structures, and/or the like, to which respective external electrical connectors 18 are mechanically and electrically coupled. Additionally, the substrate 20 has bond structures to which respective external electrical connectors 18 are mechanically and electrically coupled.

A person having ordinary skill in the art will readily understand how the package 10 may be formed, and a brief discussion of such is provided herein. The die 12 may initially be part of a wafer that undergoes semiconductor processing to form appropriate devices. For example, the die 12 may contain logic circuitry, analog circuitry, memory circuitry, the like, or a combination thereof. Electrical pads, such as aluminum pads, may be formed exposed through a top passivation layer on an active side of the die. Pillars, such as metal pillars, may be formed on the pads using a plating process. A sacrificial layer may then be coated, laminated, or the like over the wafer, such as over the pillars and the top passivation layer. The die 12 may then be singulated from the wafer by dicing or sawing, and a pick-and-place tool may place the die 12 on a carrier substrate, which may be a glass substrate, silicon substrate, aluminum oxide substrate, or the like, with a die attach film, such as any suitable adhesive, epoxy, ultraviolet (UV) glue (which loses its adhesive property when exposed to UV lights), or the like, adhering the die 12 to the carrier substrate. The pillars, e.g., the active side of the die 12, may be disposed opposite from the carrier substrate. An encapsulating process may then encapsulate the die 12 with an encapsulant 14. For example, a compression molding, lamination, or the like, using a molding compound may encapsulate the die 12. A grinding process, such as using a chemical mechanical polish (CMP), may be used to expose the sacrificial layer through the encapsulant 14. The sacrificial layer may then be removed using, for example, an appropriate etching process.

The redistribution structure 16 may comprise one or more dielectric layers and one or more conductive patterns. After removing the sacrificial layer, a first dielectric layer, such as a polybenzoxazole (PBO), polyimide, benzocyclobutene (BCB), the like, or a combination thereof, can be formed over the die 12, such as by spin coating or the like, and planarized to expose the pillars. A second and any subsequent dielectric layers, such as a PBO, polyimide, BCB, the like, or a combination thereof, can be formed over an underlying dielectric layer and/or encapsulant, such as by spin coating or the like. Openings can be formed through any of the dielectric layers to underlying conductive features using, for example, a photolithography process, etching, laser drilling, or the like. Conductive patterns, such as including redistribution patterns in the dielectric layers and bonding pads on a top dielectric layer, can be formed on the dielectric layers and in the openings, for example, using a plating process.

A ball drop process may then be used to form external electrical connectors 18 on the bond pads of the package 10.

The ball drop process can use solder, such as a lead-free solder, to form the external electrical connectors 18 on the package 10. The package 10 may then be removed from the carrier substrate, such as by exposing the die attach film to UV light or to an appropriate solvent to release the package 10. The package 10 may be placed on the substrate 20, and a reflow process may be used to mechanically and electrically couple the external electrical connectors 18 to the substrate 20.

An underfill material 22 is around the periphery of the package 10 and between the package 10 and the substrate 20. A gap 24, such as an air gap, is formed in a central region between the package 10 and the substrate 20. The underfill material 22 may be continuously around the package 10, which may cause the gap 24 to be sealed in the central region. The underfill material 22 may surround and encapsulate individuals ones of the external electrical connectors 18 along the periphery of the package 10.

The underfill material 22 may be formed by controlling an amount of underfill material dispensed around the package 10 while the structure remains unmoving or static. A two-pass dispense process may be used. For example, in a first pass, a small amount of underfill material 22 may be dispensed along a small portion of each lateral edge of the package 10, and in a second pass, underfill material 22 may be dispensed along an entirety of each lateral edge of the package 10. FIGS. 2A, 2B, and 3 illustrate examples of two-pass dispense processes. FIGS. 2A, 2B, and 3 illustrate a layout view of the external electrical connectors 18 on the package 10. In FIG. 2A, a first pass dispense 30 dispenses underfill material 22 along respective central portions of each edge of the package 10. In FIG. 2B, a first pass dispense 32 dispenses underfill material 22 along each corner portion of the package 10. In FIG. 3, a second pass dispense 34 dispenses underfill material 22 along the respective entireties of each lateral edge. FIGS. 2A, 2B, and 3 are examples, and different two-pass, or more pass, processes may be used. Also, embodiments contemplate a single-pass process to form the underfill material 22. Some embodiments contemplate applying the underfill material 22 before and/or after attaching the package 10 to the substrate 20, e.g., pre-surface mount technology (SMT) and/or post-SMT.

Referring back to FIG. 1, the underfill material 22 extends a distance 26 from a lateral edge of the package 10 inward towards the central region between the package 10 and the substrate 20. A distance 28 is illustrated, which may be, for example, a lateral width or length of the package 10. Distance 26 may be equal to or greater than zero, and may be less than half the distance 28, which may be the smallest lateral distance of the package 10. For example, distance 26 may be:

$$0 \leq D_{26} < \frac{D_{28}}{2},$$

where distance 26 is "$D_{26}$," and distance 28 is "$D_{28}$." In some embodiments, the underfill material 22 fills between about 10% and about 70%, such as between about 20% and about 50% and further between about 20% and about 40%, of the region between the package 10 and the substrate 20.

FIG. 4 illustrates another example of a layout view of a pattern of external electrical connectors 62 on a package 60. The external electrical connectors 62 are in two rows along each edge of the package 60. The underfill material 64 encapsulates and surrounds each of the external electrical connectors 62, and in another example, each of the external electrical connectors 62 may not be encapsulated. A central region 66 is where a gap, such as an air gap, is formed. The underfill material 64 may be formed as discussed above.

Embodiments may achieve advantages. For example, a FOWLP structure similar to the structure illustrated in FIG. 1 and having an area of 15×15 mm² underwent reliability tests and had improved characteristics. In a thermal cycling test, where the thermal cycle included ranging from −40° C. to 125° C. with 2 cycles per hour, the FOWLP structure underwent 1205 cycles before a failure, such as ball cracking. In a drop test, for example, using an acceleration of 5000 G, the FOWLP structure underwent 20 drops without a failure. These results were determined to be improvements over similar structures without an underfill material and with a full underfill material. Embodiments may advantageously be applied to packages having larger package sizes, finer ball pitch, smaller ball size, thinner package height, or a combination thereof to enhance reliability of such packages.

An embodiment is a structure comprising a first package, a substrate, and first external electrical connectors mechanically and electrically coupling the first package to the substrate. The first package contains a first die. The first external electrical connectors are between the first package and the substrate. An underfill material is around a first periphery region of the first package and between the first periphery region and the substrate. A first gap is between a first central region of the first package and the substrate, and does not contain the underfill material.

Another embodiment is a structure comprising a package, a substrate, and external electrical connectors disposed between the package to the substrate. The package comprises a die having an active side, an encapsulant at least laterally encapsulating the die, and a redistribution structure on the active side of the die and the encapsulant. The external electrical connectors mechanically and electrically couple the substrate to the package, and the electrical connectors are electrically coupled to the active side of the die through the redistribution structure. An underfill material is around outer edges of the package and is disposed between the outer edges of the package and the substrate. An air gap is between the package and the substrate, and the underfill material encircles the air gap.

A further embodiment is a method comprising attaching a package to a substrate using external electrical connectors, and forming an underfill material around a periphery region of the package and in a first space between the periphery region and the substrate. The external electrical connectors are disposed between the package and the substrate. The package comprises an encapsulated die and a redistribution structure electrically coupling the die to the external electrical connectors. A second space is between a central region of the package and the substrate and does not comprise the underfill material.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
    a first package comprising:
        a first die comprising:
            a passivation layer on an active side of the first die;
            a conductive pillar electrically connected to a conductive pad in the passivation layer; and
            a dielectric layer disposed around the conductive pillar;
        an encapsulant at least laterally encapsulating the first die; and
        a redistribution structure on an active side of the first die and the encapsulant, wherein the redistribution structure extends laterally past edges of the first die, and wherein an conductive feature in the redistribution structure is electrically connected to the conductive pad through the conductive pillar;
    a substrate;
    first external electrical connectors mechanically and electrically coupling the first package to the substrate, the first external electrical connectors being between the first package and the substrate; and
    an underfill material around a first periphery region of the first package and between the first periphery region and the substrate, a first gap being between a first central region of the first package and the substrate and not containing the underfill material, wherein a sidewall of the underfill material is disposed between a first one of the first external electrical connectors and a second one of the first external electrical connectors disposed within the first gap, wherein the underfill material extends along sidewalls of the redistribution structure, and wherein the underfill material extends higher than a surface of the passivation layer opposite the dielectric layer and lower than a surface of the first die opposite the redistribution structure.

2. The structure of claim 1, wherein the first gap is an air gap.

3. The structure of claim 1, wherein the underfill material seals the first gap.

4. The structure of claim 1, wherein the underfill material surrounds at least exterior ones of the first external electrical connectors on the first periphery region of the first package.

5. The structure of claim 1, wherein the underfill material fills greater than or equal to 10 percent and no more than 70 percent of a volume between the first package and the substrate.

6. The structure of claim 1, wherein the underfill material fills greater than or equal to 20 percent and no more than 50 percent of a volume between the first package and the substrate.

7. The structure of claim 1, wherein the underfill material fills greater than or equal to 20 percent and no more than 40 percent of a volume between the first package and the substrate.

8. The structure of claim 1, wherein the redistribution structure comprises a dielectric layer and a conductive pattern on the dielectric layer, the conductive pattern electrically coupling the first die to the first external electrical connectors.

9. A structure comprising:
    a package comprising:
        a die having an active side,
        an encapsulant at least laterally encapsulating the die, and
        a redistribution structure on the active side of the die and the encapsulant, wherein the redistribution structure extends laterally past sidewalls of the die,
    a substrate;
    external electrical connectors disposed between the package to the substrate, the external electrical connectors mechanically and electrically coupling the substrate to the package, the external electrical connectors being electrically coupled to the active side of the die through the redistribution structure; and
    an underfill material around outer edges of the package and disposed between the outer edges of the package and the substrate, an air gap being between the package and the substrate, the underfill material encircling the air gap, wherein a sidewall of the underfill material and at least one of the external electrical connectors defines an outer sidewall of the air gap extending from a bottom surface of the package to a top surface of the substrate, wherein within the outer sidewalls of the air gap, the air gap is free of any exposed electrical features on the bottom surface of the package and the top surface of the substrate in a top-down view of the structure, and wherein the underfill material extends along sidewalls of the redistribution structure.

10. The structure of claim 9, wherein the underfill material surrounds at least exterior ones of the external electrical connectors.

11. The structure of claim 9, wherein the underfill material continuously encircles the air gap.

12. The structure of claim 9, wherein the underfill material fills between 10 percent and 70 percent of a space between the package and the substrate.

13. The structure of claim 9, wherein the underfill material fills between 20 percent and 50 percent of a space between the package and the substrate.

14. The structure of claim 9, wherein the sidewall of the underfill material is curved.

15. A method comprising:
    attaching a package to a substrate using external electrical connectors, the external electrical connectors being disposed between the package and the substrate, the package comprising an encapsulated die and a redistribution structure electrically coupling the encapsulated die to the external electrical connectors; and
    forming an underfill material around a periphery region of the package and in a first space between the periphery region and the substrate, a second space between a central region of the package and the substrate not comprising the underfill material, wherein exterior ones of the external electrical connectors are fully disposed in the first space, wherein first interior ones of the external electrical connectors are fully disposed in the second space, wherein a second interior one of the external electrical connectors is partially disposed in the first space and partially disposed in the second space, wherein the forming the underfill material comprises dispensing the underfill material on the substrate prior to attaching the package to the substrate, wherein a sidewall of the underfill material defines an outer perimeter of the second space, and wherein a first interface between an encapsulant and the encapsulated die is disposed closer to an second interface between a sidewall of the redistribution structure and the underfill material than the sidewall of the underfill material defining the outer perimeter of the second space.

16. The method of claim 15, wherein the underfill material is formed continuously around the periphery region.

17. The method of claim 15, wherein the second space comprises air.

18. The method of claim 15, wherein the second space is between 30 percent and 90 percent of a volume between the package and the substrate.

19. The method of claim 15, wherein the underfill material fills greater than or equal to 20 percent and no more than 40 percent of a volume between the package and the substrate.

20. The method of claim 15, wherein the package comprising:
a first die comprising:
 a passivation layer on an active side of the first die;
 a conductive pillar electrically connected to a conductive pad in the passivation layer; and
 a dielectric layer disposed around the conductive pillar;
an encapsulant at least laterally encapsulating the first die; and
a redistribution structure on an active side of the first die and the encapsulant, wherein the redistribution structure extends laterally past edges of the first die, wherein an conductive feature in the redistribution structure is electrically connected to the conductive pad through the conductive pillar, wherein the underfill material extends along sidewalls of the redistribution structure, and wherein the underfill material extends higher than a surface of the passivation layer opposite the dielectric layer and lower than a surface of the first die opposite the redistribution structure.

* * * * *